(12) United States Patent
Yamada

(10) Patent No.: US 8,889,996 B2
(45) Date of Patent: Nov. 18, 2014

(54) CABLE CONNECTION STRUCTURE AND CABLE CONNECTION METHOD

(75) Inventor: Junya Yamada, Kawasaki (JP)

(73) Assignee: Olympus Corporation, Tokyo (JP)

( * ) Notice: Subject to any disclaimer, the term of this patent is extended or adjusted under 35 U.S.C. 154(b) by 163 days.

(21) Appl. No.: 13/402,021

(22) Filed: Feb. 22, 2012

(65) Prior Publication Data

US 2012/0214359 A1 Aug. 23, 2012

(30) Foreign Application Priority Data

Feb. 22, 2011 (JP) .................. 2011-035432

(51) Int. Cl.
*H05K 1/00* (2006.01)

(52) U.S. Cl.
USPC .......................... 174/261; 174/251

(58) Field of Classification Search
USPC .................................. 174/251, 261
See application file for complete search history.

(56) References Cited

U.S. PATENT DOCUMENTS 3,383,457 A * 5/1968 Schumacher et al. ........ 174/261

FOREIGN PATENT DOCUMENTS

| JP | 07-135037 | 5/1995 |
| JP | 2006-165485 | 6/2006 |

* cited by examiner

*Primary Examiner* — Jeremy C Norris
(74) *Attorney, Agent, or Firm* — Scully, Scott, Murphy & Presser, PC

(57) ABSTRACT

A cable connection structure includes a cable and a substrate that includes a connection electrode to which the cable is connected. The substrate includes two or more protrusions that form a groove in which a conductor part of the cable is arranged. The height of the protrusions is greater than the diameter of the conductor part of the cable.

17 Claims, 12 Drawing Sheets

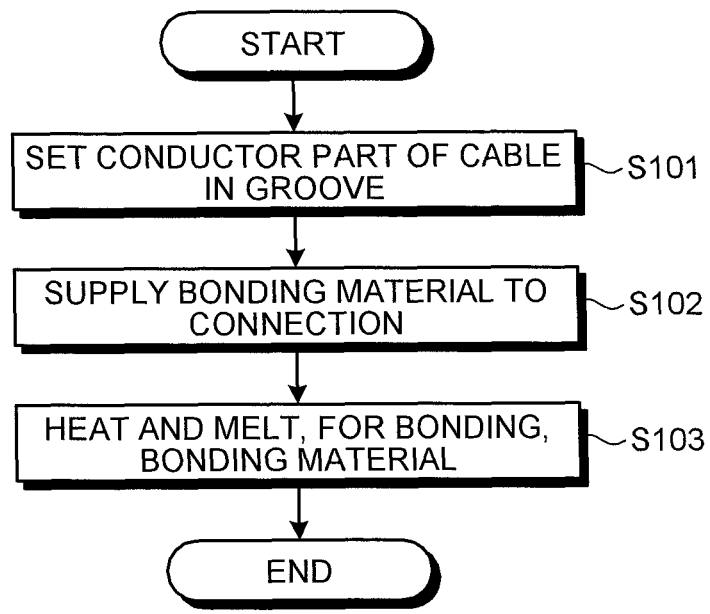
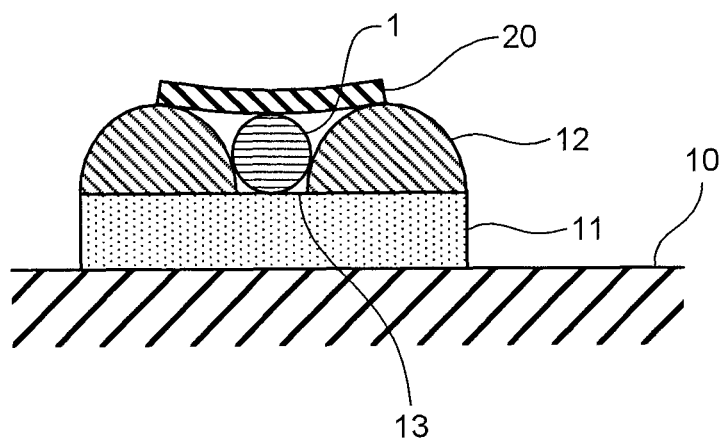

CABLE CONNECTION STRUCTURE AND CABLE CONNECTION METHOD

CROSS-REFERENCE TO RELATED APPLICATIONS

This application is based upon and claims the benefit of priority from Japanese Patent Application No. 2011-035432, filed on Feb. 22, 2011, the entire contents of which are incorporated herein by reference.

BACKGROUND OF THE INVENTION

1. Field of the Invention

The present invention relates to a cable connection structure that connects a cable to a substrate and a cable connection method.

2. Description of the Related Art

When a cable is connected to a printed board, an electrode for connecting the cable is formed on the printed board and the connection electrode and a conductor part of the cable are connected by, for example, soldering.

With the thinning of conductor parts in recent years, technologies have been disclosed in which grooves, to which a core wire and a shielded wire fit, are formed by etching cable connection electrodes on a substrate for connecting a coaxial cable (for example, Japanese Laid-open Patent Publication No. H07-135037). According to the technology of Japanese Laid-open Patent Publication No. H07-135037, the core wire and the shielded wire can be put in the formed grooves and thus the coaxial cable can be connected to a given position without being shifted.

Alternatively, a mount structure has been proposed in which surface mount members including a group of gull-wing or J-type leads are mounted on a printed board (for example, Japanese Laid-open Patent Publication No. 2006-165485). In this mount structure, multiple pads extending in the direction in which the leads extend are provided on the printed board in accordance with tip portions of the lead group, and at least one conductive protrusion, such as a solder bump, is formed on the pad on each of both sides in the direction in which the tip of the lead extends. The protrusion surface has a curved surface or an oblique surface such that it obliquely makes contact with the corner of both ends of the lower surface of the lead cable from the lateral lower side.

When the connection electrode and the conductor part of the cable are connected by soldering, etc., a heat tool is pushed against the connection between the connection electrode and the conductor part so that solder is heated and melted and the connection electrode and the conductor part are bonded. However, the conductor part may be squashed or shifted due to the pressure of the heat tool. Because squashing the conductor part may cause a break and a short-circuit due to a decrease in strength, there is a demand for a structure for connecting a connection electrode and a conductor part, the structure being capable of preventing the conductor from being squashed.

SUMMARY OF THE INVENTION

A cable connection structure according to an aspect of the present invention connects a cable and a substrate that comprises a connection electrode for connecting the cable, wherein the substrate comprises two or more protrusions, on the connection electrode, that form a groove in which a conductor part of the cable is arranged, and the height of the protrusions is greater than the diameter of the conductor part of the cable.

The above and other features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 5 is a flowchart illustrating a connection method of the cable connection structure according to the first embodiment;

FIG. 6 is a cross-sectional view of a connection between a conductor part and protrusions after solder is supplied;

DETAILED DESCRIPTION OF THE PREFERRED EMBODIMENTS

Preferred embodiments of a cable connection structure according to the present invention will be described with reference to the accompanying drawings. The embodiments do not limit the present invention. The same or like parts are designated by the same reference numbers throughout the drawings.

Figure 1:
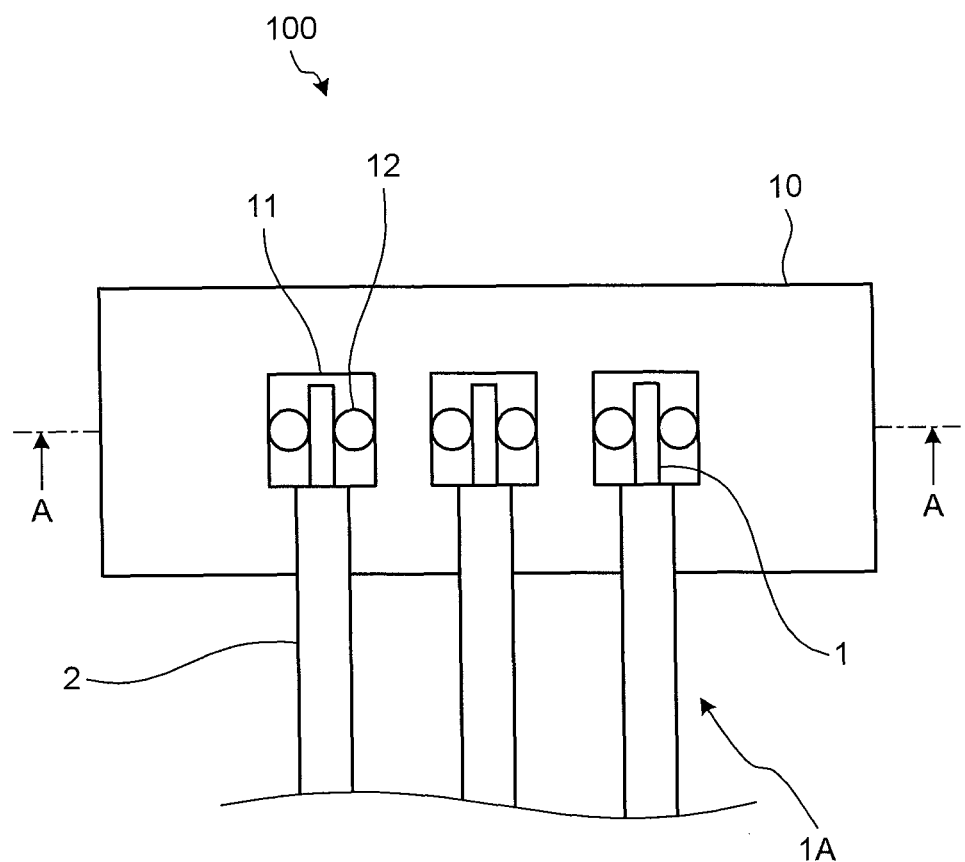
FIG. 1 is a schematic diagram of a cable connection structure according to a first embodiment.
Figure 2:
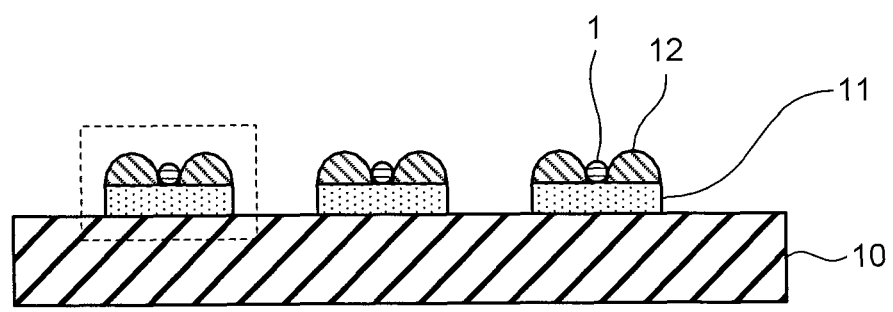
FIG. 2 is a cross-sectional view of the cable connection structure taken along the A-A line.
Figure 3:
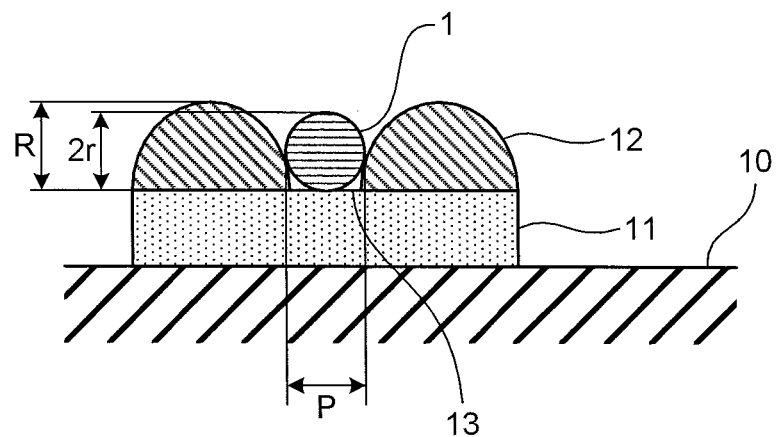
FIG. 3 is an enlarged view of the part in FIG. 2 denoted by the dotted line.

FIG. 1 is a schematic diagram of a cable connection structure 100 according to a first embodiment. FIG. 2 is a cross-sectional view of the cable connection structure 100 in FIG. 1 taken along the A-A line. FIG. 3 is an enlarged view of the part represented by the dotted line in FIG. 2. As depicted in FIG. 1, the cable connection structure 100 according to the first embodiment includes cables 1A and a substrate 10 to which the cables 1A are connected.

The cable 1A includes a conductor part 1, which is a core wire, and an outer shield 2 that is an insulator provided on the outer circumference of the conductor part 1. The substrate 10 shown in FIG. 1 includes three connection electrodes 11 and the three cables 1A are connected to the connection electrodes 11, respectively. The number of connection electrodes and the number of cables are not limited as long as the number of connection electrodes 11 corresponds to the number of cables 1A.

As depicted in FIGS. 1 to 3, two semi-spherical protrusions 12 are arranged side by side on each of the connection electrodes 11. The protrusion 12 may be formed into, instead of a semi-spherical shape, a mushroom-like shape or a cylindrical shape with a semi-sphere placed on the top. The conductor part 1 of the cable 1A is arranged in a groove 13 formed by the side surfaces of the two protrusions 12 and the surface of the connection electrode 11. The protrusions 12 are formed by arranging bumps, such as gold bumps or high-melting-point solder bumps, on the connection electrode 11. Throughout the specification, high-melting-point solder bumps mean bumps formed of a solder having a melting point sufficiently higher than the melting point of a tin/lead eutectic solder (having a melting point of 184 degrees) or a tin/silver/copper solder widely used as a lead-free solder (e.g., Sn-3.0Ag-0.5Cu composition has a melting point of approximately 220 degrees) (e.g., a tin/lead solder of Sn-90Pb composition has a melting point (solidus temperature) of 275 degrees). In the first embodiment, as depicted in FIG. 3, it is satisfactory if the height R of the protrusion 12 is greater than the diameter $2r$ of the conductor part 1 of the cable 1A. Because the height R is greater than the diameter $2r$ of the conductor part 1 of the cable LA, when a bonding material, such as solder, is heated and melted to bond the conductor part 1 and the connection electrode 11 by using a heat tool, such as a thermocompression bonding apparatus, the heat tool makes contact with the protrusions 12 and thus stops lowering, and then starts heating at the height of the protrusions 12. Accordingly, no load is applied to the conductor part 1, which prevents the conductor from being squashed and thus reduces the occurrence of connection failures. When the height R of the protrusions 12 is approximately equal to the diameter $2r$ of the conductor part 1 or, even when the height R is slightly lower than the diameter $2r$, the pressure on the conductor part 1 can be reduced, which reduces occurrence of connection failures.

Furthermore, in terms of preventing a positional shift of the conductor part 1, it is preferable that the width P of the groove 13 formed from the two or more protrusions 12 be approximately equal to that of the diameter $2r$ of the conductor part 1. Even if the width P of the groove 13 is greater than the diameter $2r$ of the conductor part 1, the height R of the protrusions 12 being greater than the diameter $2r$ of the conductor part 1 prevents the conductor part 1 from being squashed when bonding is performed. In this specification, the width P of the groove 13 means a value with which the distance between the protrusions 12 forming the groove 13 is the minimum when the conductor part 1 makes contact with the two protrusions 12.

Figure 4:
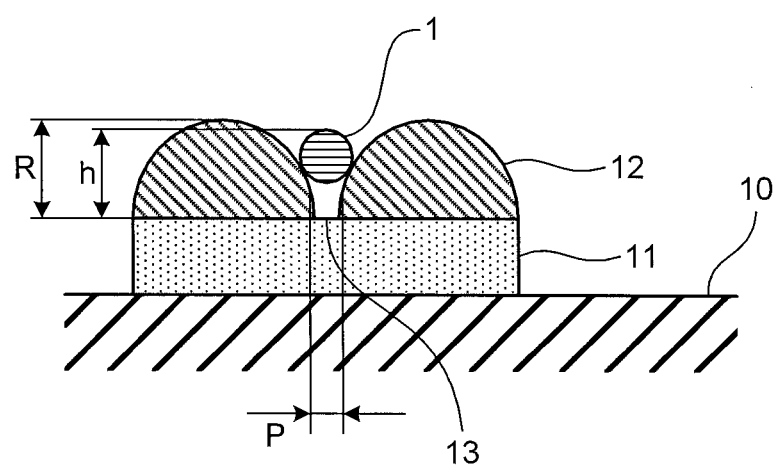
FIG. 4 is an enlarged view of an example of a connection of a conductor part.

As depicted in FIG. 4, even if the width P of the groove 13 is smaller than the diameter $2r$ of the conductor part 1, it is possible to prevent the conductor part 1 from being squashed when bonding is performed and prevent a positional shift of the conductor part 1 of the cable 1A by arranging and forming the protrusions 12 such that, when the conductor part 1 is set in the groove 13 formed by the protrusions 12, the height R of the protrusions 12 is greater than the height h from the top surface of the connection electrode 11 to the top surface of the conductor part 1. Accordingly, it is possible to stably connect a large number of fine cables to a narrow area and this structure is suitable for the structure of an endoscope or an ultrasonic imaging system (ultrasonic endoscope).

A method of connecting the substrate 10 and the cable 1A of the cable connecting structure 100 according to the first embedment will be described here. FIG. 5 is a flowchart illustrating the connection method of the cable connection structure 100 according to the first embodiment.

First, the conductor part 1 of the cable 1A is set in the groove 13 that is formed by the protrusions 12 arranged on the connection electrode 11 (step S101).

After the conductor part 1 is set in the groove 13, a bonding material, such as solder, is supplied to the connection between the conductor part 1 and the connection electrode 11 (step S102). FIG. 6 is a cross-sectional view of the connection between the protrusions 12 and the conductor part 1 after solder 20 is supplied.

Figure 7:
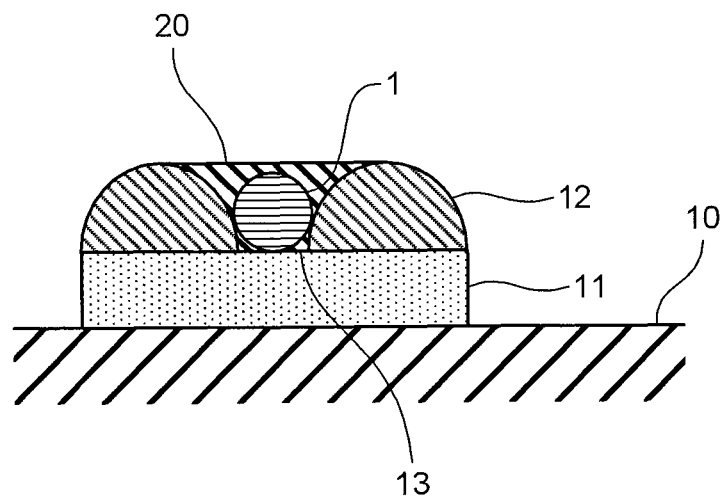
FIG. 7 is a cross-sectional view of the connection between the conductor part and the protrusions after bonding with solder.

Thereafter, the supplied solder 20 is heated and melted to bond the conductor part 1 and the connection electrode 11 (step S103) so that the substrate 10 and the cable 1A are connected. FIG. 7 is a cross-sectional view of the connection between the conductor part 1 and the protrusions 12 after bonding with the solder 20.

In the above-described cable connection method, after the conductor part 1 of the cable 1A is set in the groove 13, the bonding material is supplied. Alternatively, after the bonding material is supplied to the groove 13, the conductor part 1 may be set in the groove 13 supplied with the bonding material. In such a case, in view of the height of the bonding material supplied to the groove 13, it is preferable to select the height R of the protrusions 12 to be greater than the height h from the top surface of the connection electrode 11 to the top surface of the conductor part 1.

Figure 8:
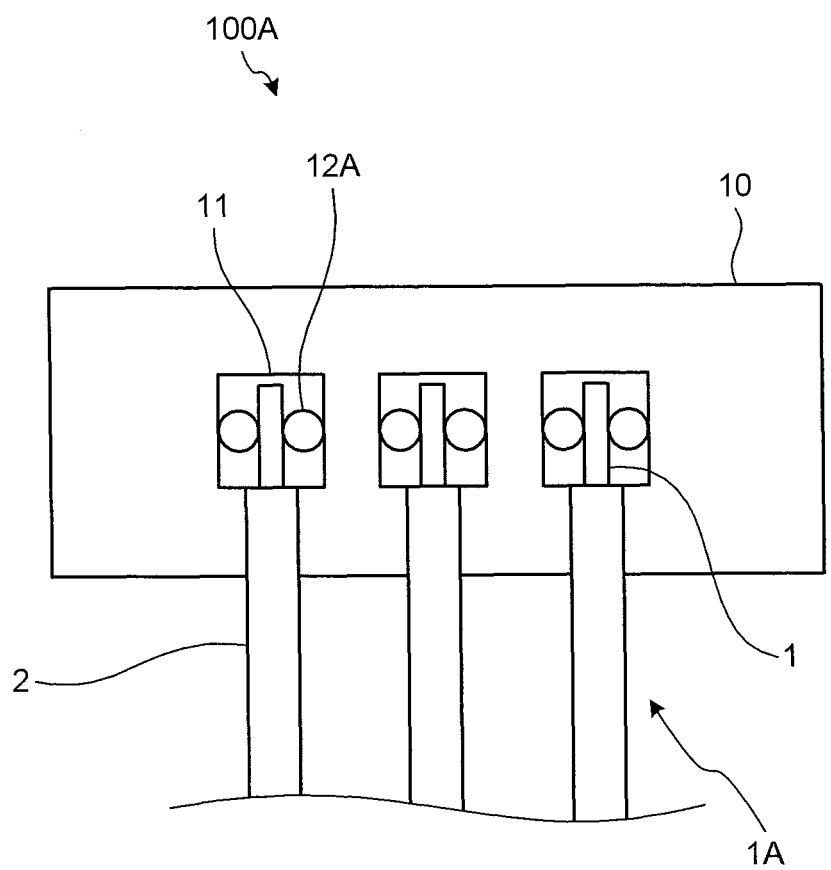
FIG. 8 is a schematic diagram of a cable connection structure according to a modification of the first embodiment.

A cable connection structure in which the protrusions are solder bumps will be exemplified here as a modification of the first embodiment. In the specification, solder bumps mean bumps formed of a tin/lead eutectic solder (having a melting point of 184 degrees), a tin/silver/copper solder widely used as a lead-free solder (e.g., Sn-3.0Ag-0.5Cu composition has a melting point of 220 degrees), or a solder having a melting point or solidus temperature lower than that of the tin/lead eutectic solder and the tin/silver/copper solder. FIG. 8 is a schematic diagram of a cable connection structure 100A of a modification of the first embodiment.

The cable connection structure 100A according to the modification of the first embodiment is different from the cable connection structure 100 according to the first embodiment in that protrusions 12A have a melting point lower than that of the protrusions 12 and the protrusions 12A are formed of a solder that melts when bonding is performed. The protrusions 12A are formed by ejecting melted solder onto the connection electrode 11.

In the cable connection structure 100A according to the modification, the height of the protrusions 12A is greater than the diameter of the conductor part 1 of the cable 1A or the height of the protrusions 12A is greater than the height from the top surface of the connection electrode 11 to the top surface of the conductor part 1, which prevents the conductor from being squashed. Accordingly, it is possible to stably connect a large number of fine cables to a narrow area and this structure is suitable for the structure of an endoscope or an ultrasonic imaging system (ultrasonic endoscope).

Figure 9:
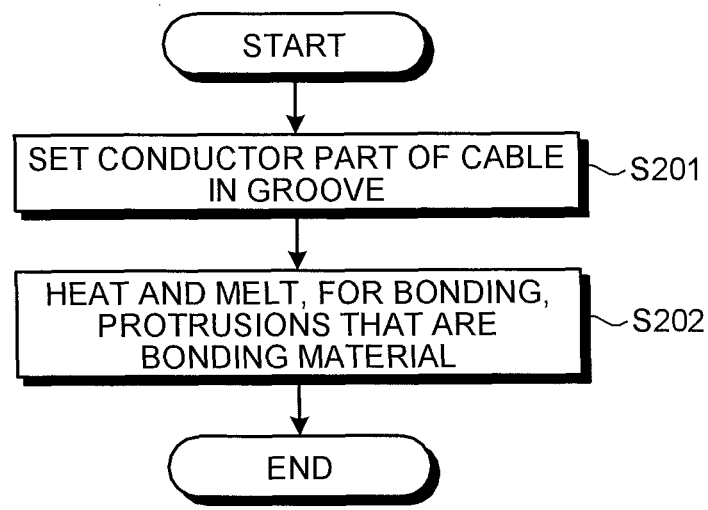
FIG. 9 is a flowchart illustrating a connection method of a cable connection structure according to the modification of the first embodiment.

A cable connection method of the cable connection structure 100A according to the modification of the first embodiment will be described here. FIG. 9 is a flowchart illustrating the connection method of the cable connection structure 100A according to the modification of the first embodiment.

First, the conductor part 1 of the cable 1A is set in the groove 13 formed of the protrusions 12A arranged on the connection electrode 11 (step S201).

Figure 10:
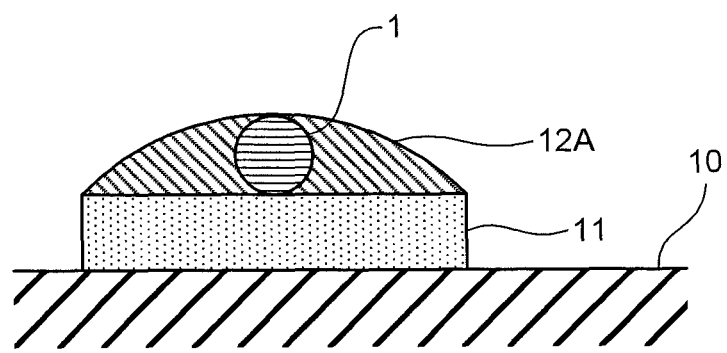
FIG. 10 is a cross-sectional view of the connection between protrusions and a conductor after bonding.

Thereafter, the protrusions 12A that are a bonding material are heated and melted to bond the conductor part 1 and the connection electrode 11 by using a heat tool (step S202) so that the cable 1A and the connection electrode 11 are connected. FIG. 10 is a cross-sectional view of the connection between the conductor part 1 and the protrusion 12A after bonding.

In the modification, solder bumps are used as the protrusions 12A and the height of the protrusions 12A is greater than the diameter of the conductor part 1 or greater than the height from the connection electrode 11 to the top surface of the conductor part 1, which prevents the conductor part 1 from being squashed during bonding, and the step of supplying a solder as a bonding material is omitted, which thus reduces the costs. Furthermore, it is possible to stably connect a large number of fine cables to a narrow area and this method is suitable for a method of manufacturing an endoscope or an ultrasonic imaging system (ultrasonic endoscope).

Figure 11:
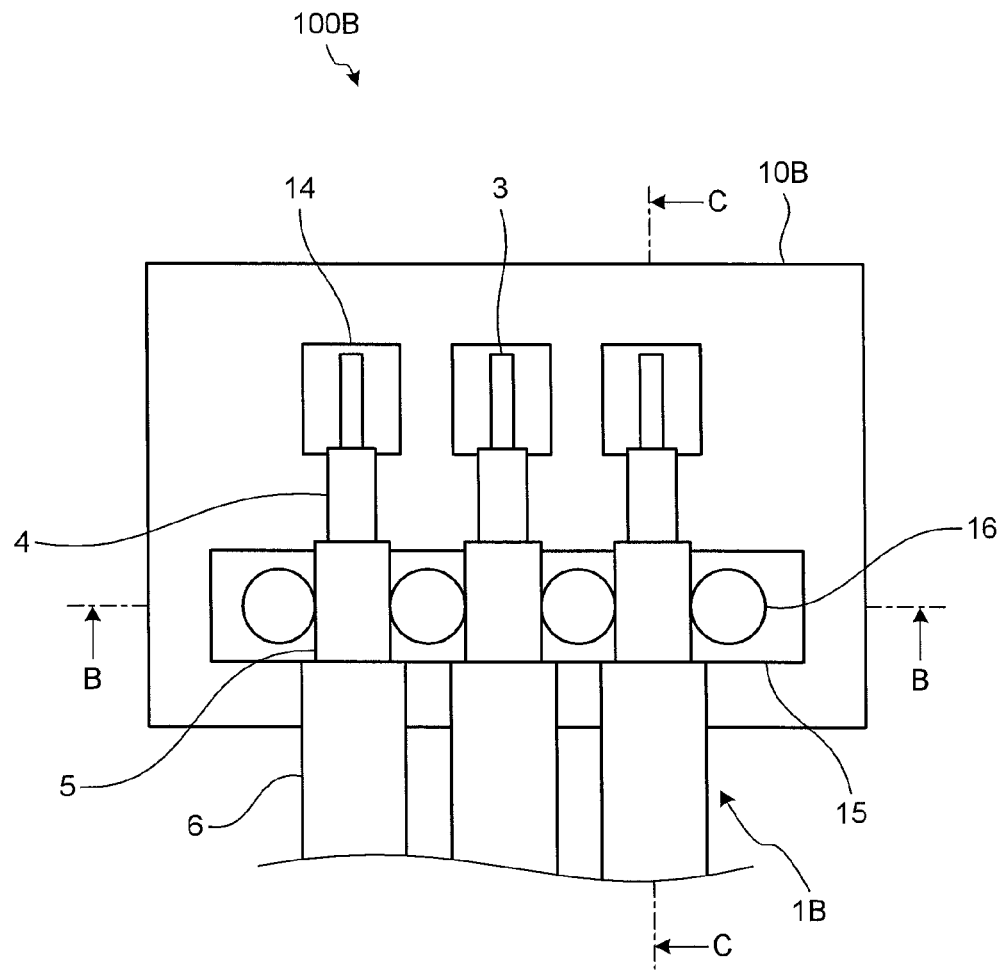
FIG. 11 is a schematic diagram of a cable connection structure according to a second embodiment.
Figure 12:
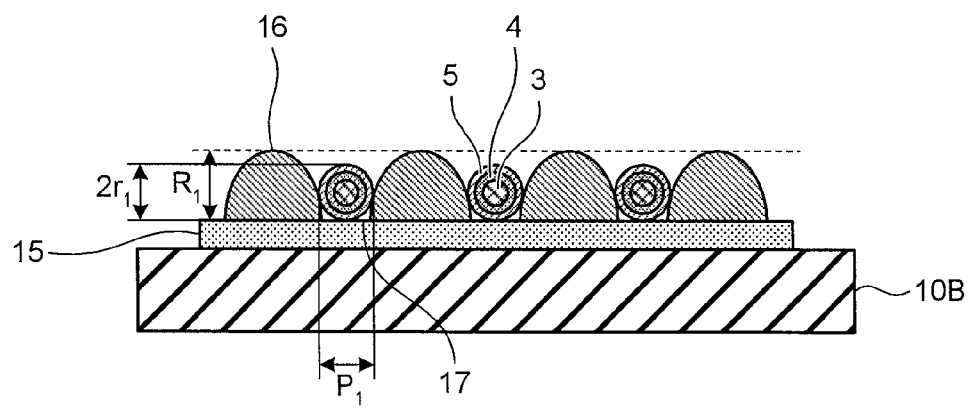
FIG. 12 is a cross-sectional view of the cable connection structure in FIG. 11 taken along the B-B line.
Figure 13:
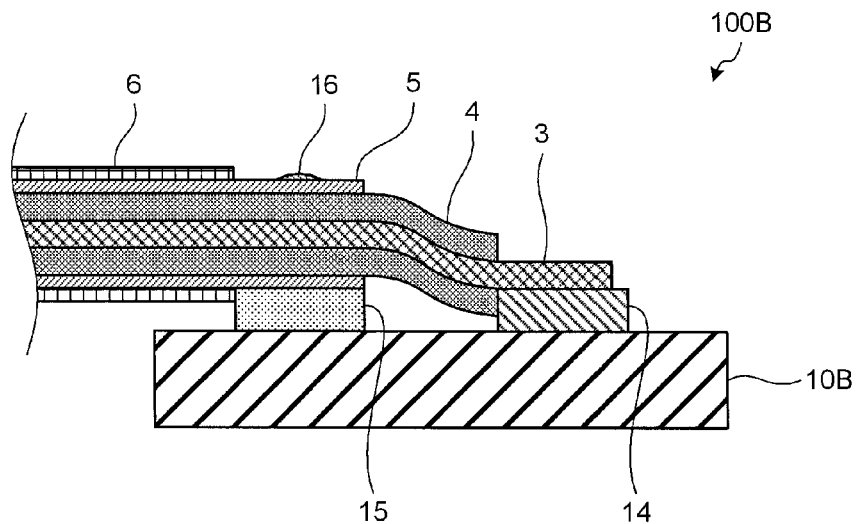
FIG. 13 is a cross-sectional view of the cable connection structure in FIG. 11 taken along the C-C line.

A second embodiment of the present invention will be described below. FIG. 11 is a schematic diagram of a cable connection structure 100B according to the second embodiment. FIG. 12 is a cross-sectional view of the cable connection structure 100B taken along the B-B line. FIG. 13 is a cross-sectional view of the cable connection structure 100B in FIG. 11 taken along the C-C line. As depicted in FIG. 11, the cable connection structure 100B according to the second embodiment includes coaxial cables 1B and a substrate 10B to which the coaxial cables 1B are connected.

The coaxial cable 1B includes a center conductor 3 serving as a core wire, an internal insulator 4 that is provided on the outer circumference of the center conductor 3, an external conductor 5 that is a shield that covers the outer circumference of the internal insulator 4, and an external insulator 6 that is provided on the outer circumference of the external conductor 5.

The substrate 10B includes center conductor connection electrodes 14 (core wire connection electrodes) to which the center conductors 3 are connected and an external conductor connection electrode 15 (shield connection electrode) to which the external conductors 5 are connected. Semi-spherical first protrusions 16 are formed on the external conductor connection electrode 15. The first protrusions 16 equal in number to the number obtained by adding 1 to the number of the external conductors 5 are formed in a line at equal intervals on the external conductor connection electrode 15 in the longitudinal direction of the external conductor connection electrode 15. Hereinafter, a case where three external conductors 5 are connected to the external conductor connection electrode 15 will be described as an example. In this case, the first protrusions 16 is equal in number to the number obtained by adding 1 to the number of the external conductor 5 to be connected, i.e., four first protrusions 16, are arranged in a line at equal intervals on the external conductor connection electrode 15. The first protrusions 16, which are arranged in a line at equal intervals on the external conductor connection electrode 15, and the external conductor connection electrode 15 form first grooves 17 equal in number to the number of the external conductors 5 to be connected (i.e., three first grooves 17). The three external conductors 5 are arranged in the first grooves, respectively. The first protrusions 16 are formed by arranging gold bumps, high-melting-point solder bumps, or solder bumps in a line at equal intervals on the external conductor connection electrode 15.

In terms of preventing a positional shift of the external conductor 5, it is preferable that the width $P_1$ of the first grooves 17 each formed by the two first protrusions 16 be approximately the same as that of the diameter $2r_1$ of the external conductors 5. However, even if the width $P_1$ of the first grooves 17 is greater than the diameter $2r_1$ of the external conductors 5, the height $R_1$ of the first protrusions 16 being greater than the diameter $2r_1$ of the external conductors 5 prevents the conductor part 1 from being squashed when bonding is performed. In this specification, the width $P_1$ of the first groove 17 means a value with which the distance between the first protrusions 16 forming the first groove 17 is the minimum when the external conductor 5 makes contact with the two first protrusions 16.

The center conductor connection electrodes 14 equal in number to the number of the center conductors 3 are formed individually on the substrate 10B. The center conductor connection electrodes 14 are formed in the direction in which the center conductors extend when the external conductors 5 are set in the first grooves 17 formed by the first protrusions 16 on the external conductor connection electrode 15.

In the second embodiment, it is satisfactory if the height $R_1$ of the first protrusions 16 is greater than the diameter $2r_1$ of the external conductors 5. Thus, because heating can be started at the height of the first protrusions 16 when a bonding material, such as a solder, is heated and melted for bonding by using a heat tool, such as a thermocompression bonding apparatus, no load is applied to the external conductors 5, which prevents the external conductors 5 from being squashed and prevents the external conductors 5 and the center conductors 3 from short-circuited due to tearing in the internal insulators 4. Furthermore, as no load is applied to the internal insulators 4, any impedance change due to squashing of the internal insulators 4 can be reduced. Accordingly, it is possible to connect a large number of fine cables to a narrow area and this structure is suitable for the structure of an endoscope or an ultrasonic imaging system (ultrasonic endoscope).

Figure 14:
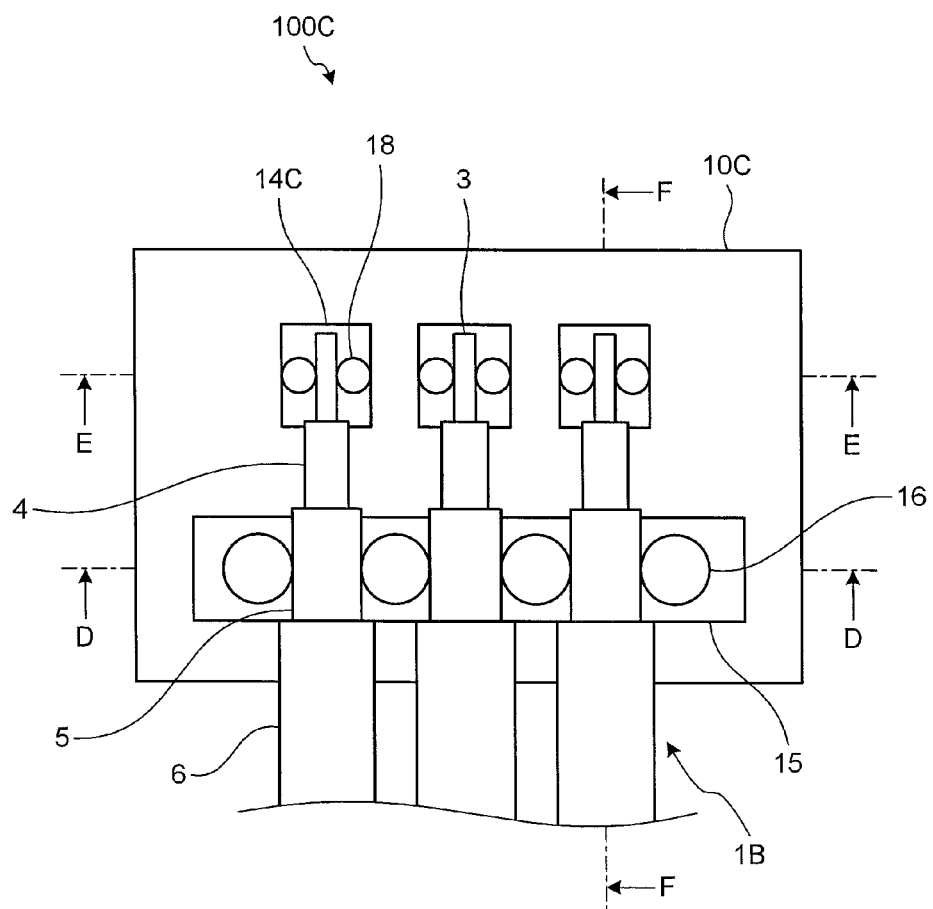
FIG. 14 is a schematic diagram of a cable connection structure according to a third embodiment.
Figure 15:
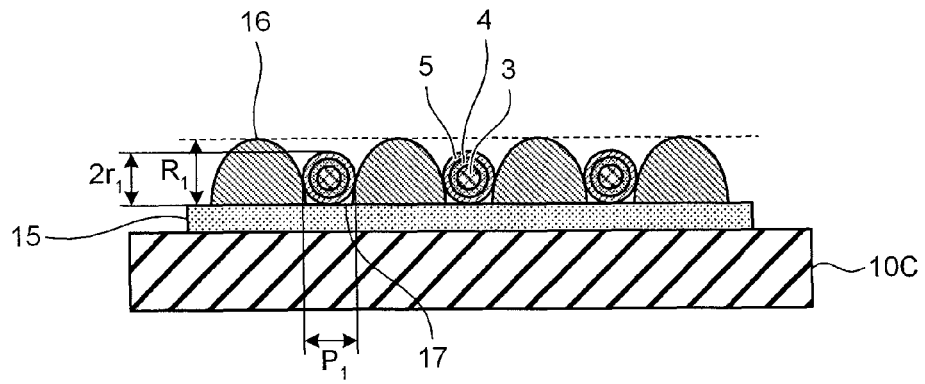
FIG. 15 is a cross-sectional view of the cable connection structure in FIG. 14 taken along the D-D line.
Figure 16:
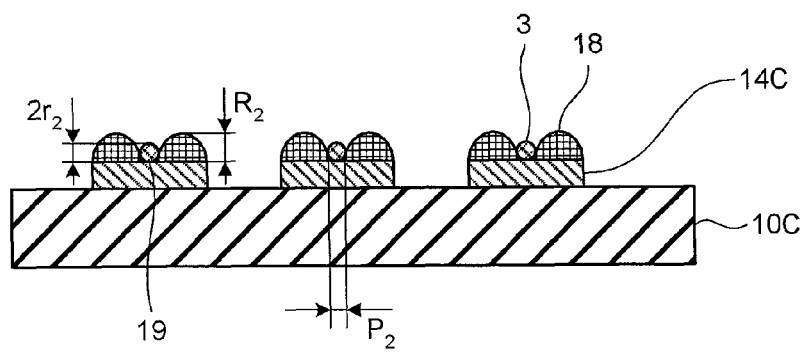
FIG. 16 is an enlarged cross-sectional view of the cable connection structure in FIG. 14 taken along the E-E line.
Figure 17:
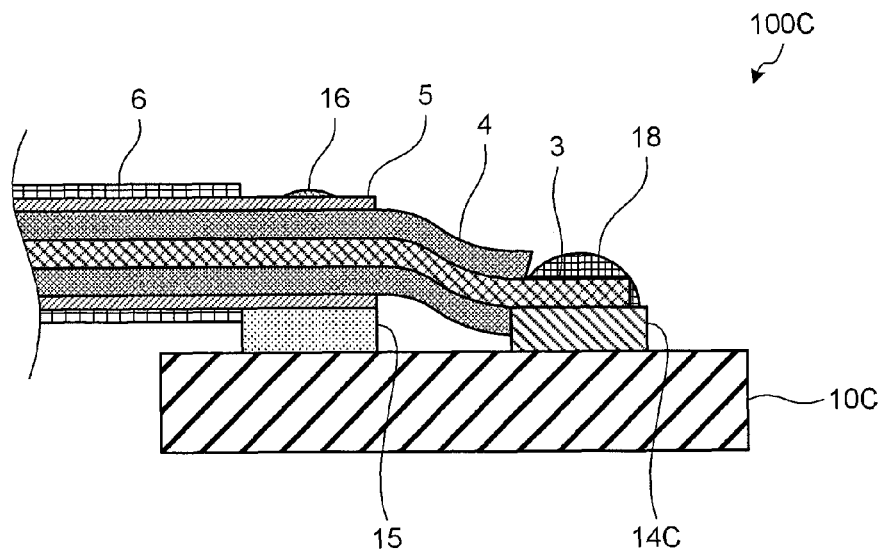
FIG. 17 is a cross-sectional view of the cable connection structure in FIG. 14 taken along the F-F line.

A third embodiment of the present invention will be described below. FIG. 14 is a schematic diagram of a cable connection structure 100C according to the third embodiment. FIG. 15 is a cross-sectional view of the cable connection structure 100C in FIG. 14 taken along the D-D line. FIG. 16 is an enlarged cross-sectional view of the cable connection structure 100C in FIG. 14 taken along the E-E line. FIG. 17 is a cross-sectional view of the cable connection structure 100C in FIG. 14 taken along the F-F line. As depicted in FIG. 14, the cable connection structure 100C according to the third embodiment includes coaxial cables 1B and a substrate 100 to which the coaxial cables 1B are connected.

The substrate 100 includes center conductor connection electrodes 14C to which the center conductors 3 are connected and an external conductor connection electrode 15 to which the external conductors 5 are connected. As is the case of the second embodiment, the semi-spherical first protrusions 16 are formed on the external conductor connection electrode 15. The first protrusions 16, which are formed in a line at equal intervals on the external conductor connection electrode 15, form the first grooves 17 equal in number to that of the external conductors 5 to be connected. Two semi-spherical second protrusions 18 are formed on the center conductor connection electrode 14C.

The second protrusions 18 are formed side by side on the center conductor connection electrode 14C in accordance with the intervals in which the external conductors 5 are connected to the external conductor connection electrode 15. The two second protrusions 18 and the center conductor connection electrode 14C form a second groove 19. The second protrusions 18 are formed by arranging gold bumps, high-melting-point solder bumps, or solder bumps side by side on the center conductor connection electrode 14C. The external conductors 5 are arranged in the first grooves 17 and the center conductors 3 are arranged in the second grooves 19, respectively, and supplied bonding materials, such as a solder or solder bumps, are melted by using a heat tool so that the external conductors 5 are connected to the external conductor connection electrode 15 and the center conductors 3 are connected to the center conductor connection electrodes 14C.

In terms of preventing a positional shift of the center conductors 3, it is preferable that the width $P_2$ of the second grooves 19 each formed by the two second protrusions 18 be approximately equal to the diameter $2r_2$ of the center conductors 3. However, even if the width $P_2$ of the second grooves 19 is greater than the diameter $2r_2$ of the center conductors 3, the height $R_2$ of the second protrusions 18 being greater than the diameter $2r_2$ of the center conductors 3 prevents the center conductor 3 from being squashed when bonding is performed. In this specification, the width $P_2$ of the second groove 19 means a value with which the distance between the second protrusions 18 forming the second groove 19 is the minimum when the center conductor 3 makes contact with two second protrusions 18.

In the third embodiment, the height $R_1$ of the first protrusions 16 is greater than the diameter $2r_1$ of the external conductors 5 and the height $R_2$ of the second protrusions 18 is greater than the diameter $2r_2$ of the center conductors 3. Accordingly, when a bonding material, such as a solder, is heated and melted for bonding by using a heat tool, such as a thermocompression bonding apparatus, heating can be started at the height of the first protrusion 16 in the connection of the external conductor 5 and at the height of the second protrusion 18 in the connection of the center conductor 3. Accordingly, no load is applied to the connection of the external conductor 5 when bonding is performed, which prevents the external conductor 5 from being squashed and prevents the external conductors 5 and the center conductors 3 from being short-circuited due to tearing in the internal insulators 4. Furthermore, no load is applied to the internal insulator 4, which reduces any impedance change due to squashing of the internal insulator 4. Similarly, no load is applied to the center conductor 3 in the connection of the center conductor 3, which prevents the center conductor 3 from being squashed. Accordingly, it is possible to connect a large number of fine cables to a narrow area and this structure is suitable for the structure of an endoscope or an ultrasonic imaging system (ultrasonic endoscope).

Figure 18:
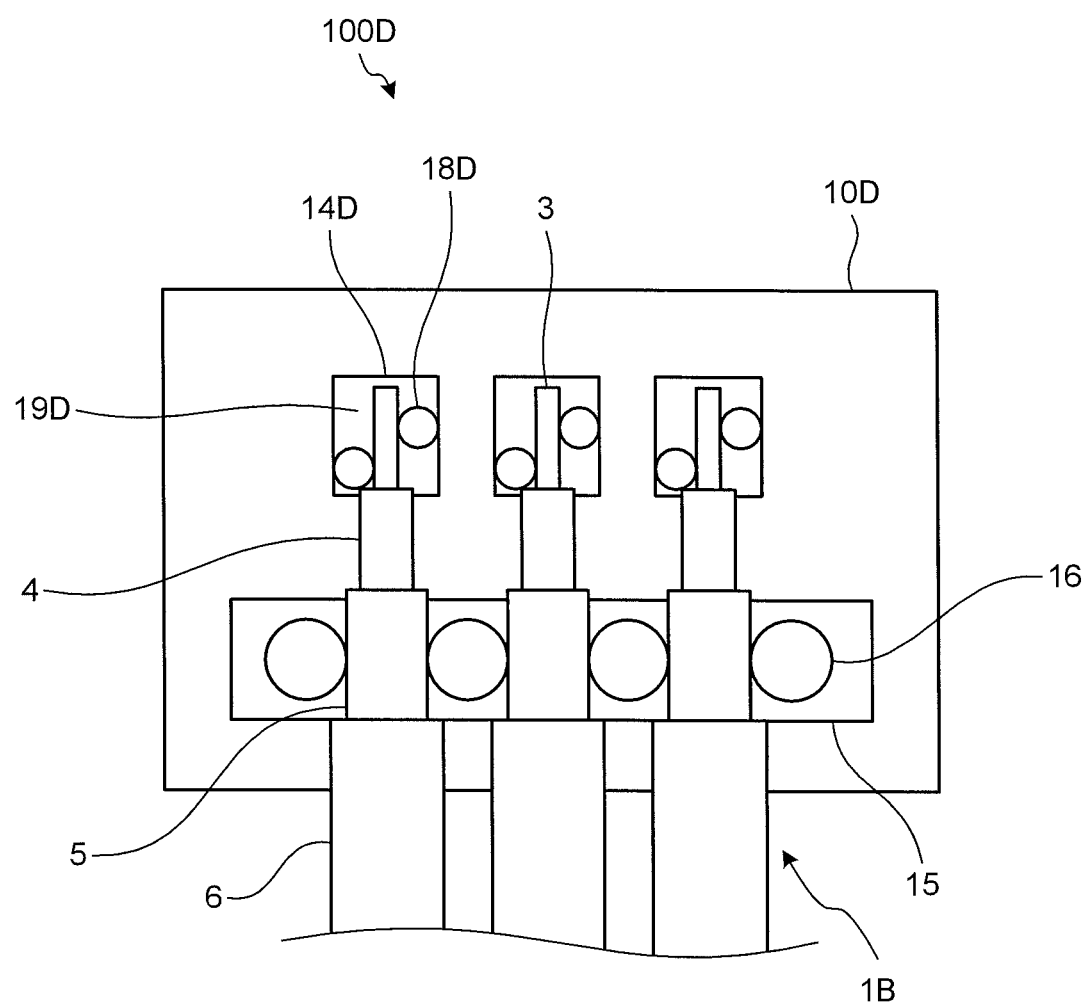
FIG. 18 is a schematic diagram of a cable connection structure according to a modification of the third embodiment.

Furthermore, a cable connection structure in which two second protrusions are arranged while being shifted will be exemplified here as a modification of the third embodiment. FIG. 18 is a schematic diagram of a cable connection structure 100D according to the modification of the third embodiment.

As depicted in FIG. 18, in the cable connection structure 100D according to the modification of the third embodiment, two semi-spherical second protrusions 18D are formed on a center conductor connection electrode 14D along the direction in which the center conductor 3 extends. The two second protrusions 18D are arranged in accordance with the intervals in which the external conductors 5 are connected to the external conductor connection electrode 15 and shifted in the longitudinal direction of the external conductor 5 set on the external conductor connection electrode 15. The center conductors 3 are arranged in second grooves 19D each formed by the two second protrusions 18D and connected to the center conductor connection electrodes 14D.

In this modification, because the height of the second protrusions 18D is greater than the diameter of the center conductors 3, when a bonding material, such as solder, is heated and melted for bonding by using a heat tool, such as a thermocompression bonding apparatus, heating can be started at the height of the second protrusion 18D when the center conductor 3 is connected. Thus, no load is applied to the center conductor 3, which prevents the center conductor 3 from being squashed. Accordingly, it is possible to stably connect a large number of fine cables to a narrow area and this structure is suitable for the structure of an endoscope or an ultrasonic imaging system (ultrasonic endoscope).

In the modification, the second groove 19D are formed by the two second protrusions 18D arranged while being shifted. The same effects can be obtained by arranging three or more second protrusions 18D, e.g., three second protrusions 18D, in a zigzag.

Figure 19:
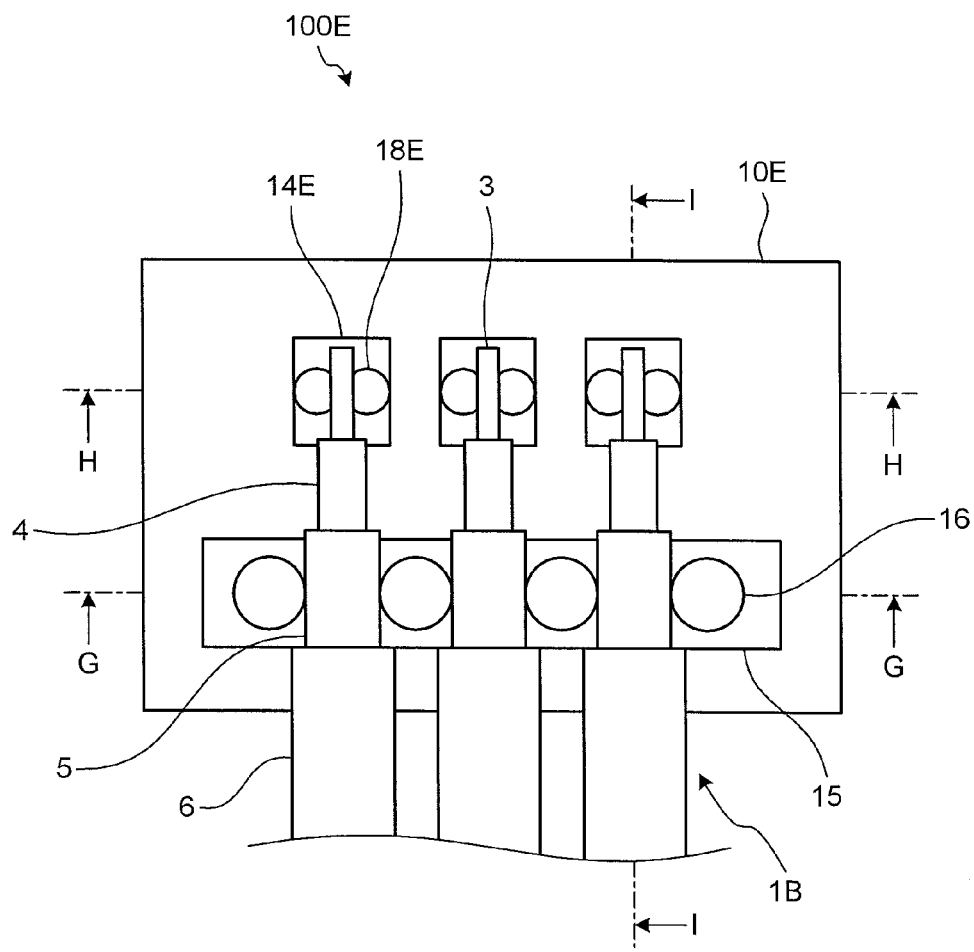
FIG. 19 is a schematic diagram of a cable connection structure according to a fourth embodiment.
Figure 20:
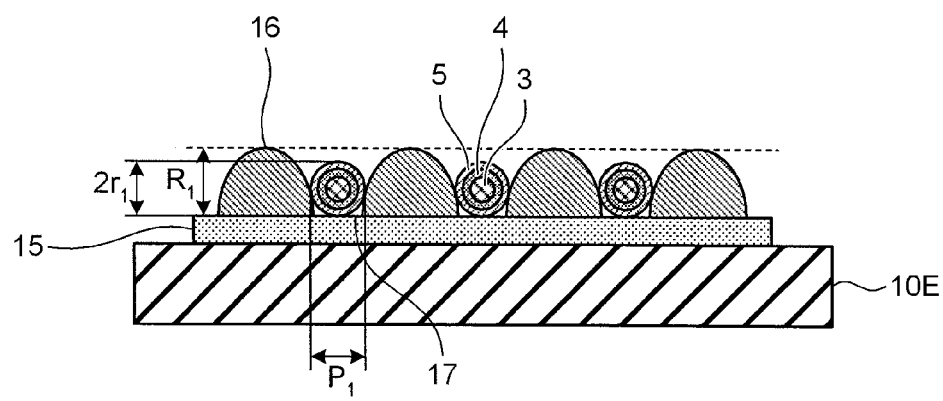
FIG. 20 is a cross-sectional view of the cable connection structure in FIG. 19 taken along the G-G line.
Figure 21:
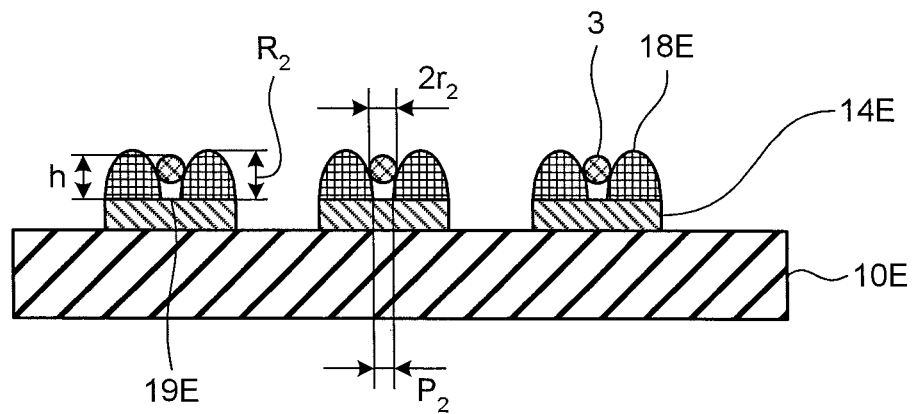
FIG. 21 is an enlarged cross-sectional view of the cable connection structure in FIG. 19 taken along the H-H line.
Figure 22:
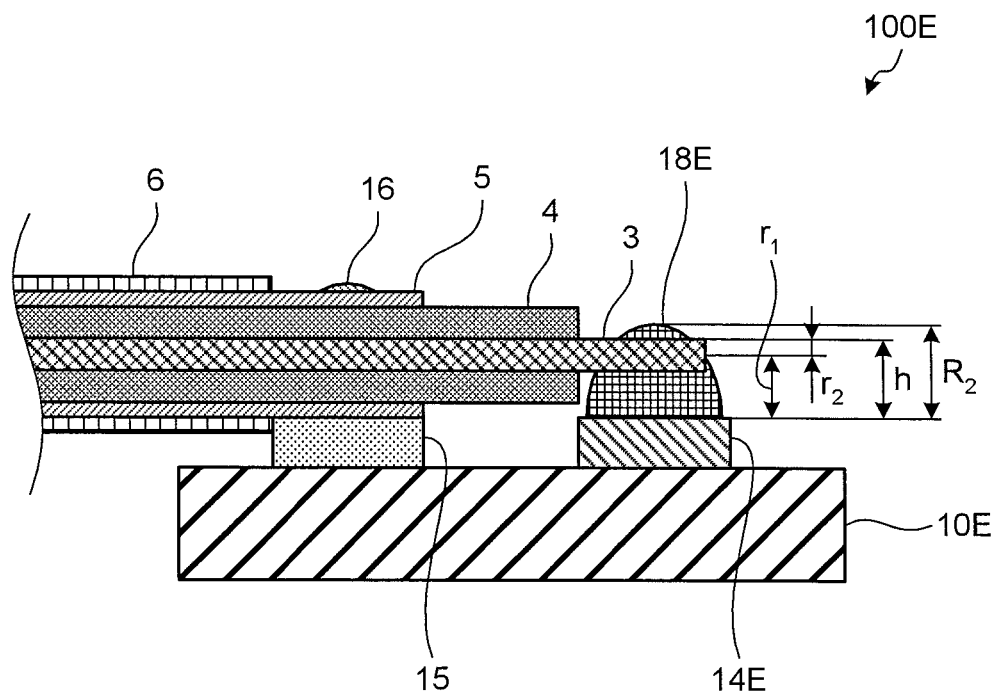
FIG. 22 is a cross-sectional view of the cable connection structure in FIG. 19 taken along the I-I line.

A fourth embodiment of the present invention will be described below. FIG. 19 is a schematic diagram of a cable connection structure 100E of the fourth embodiment. FIG. 20 is a cross-sectional view of the cable connection structure 100E in FIG. 19 taken along the G-G line. FIG. 21 is an enlarged cross-sectional view of the cable connection structure 100E in FIG. 19 taken along the H-H line. FIG. 22 is a cross-sectional view of the cable connection structure 100E taken along the I-I line. As depicted in FIG. 19, the cable connection structure 100E according to the fourth embodiment includes coaxial cables 1B and a substrate 10E to which the coaxial cables 1B are connected.

The substrate 10E includes center conductor connection electrodes 14E to which the center conductors 3 are connected and the external conductor connection electrode 15 to which the external conductors 5 are connected. The center conductor connection electrodes 14E and the external conductor connection electrodes 15 are formed so that their top surfaces are at an equal height. As is the case of the second embodiment, the semi-spherical first protrusions 16 are formed on the external conductor connection electrode 15. The semi-spherical first protrusions 16 formed in a line at equal intervals on the external conductor connection electrode 15 form the first grooves 17 equal in number to the number of the external conductors 5 to be connected. Two semi-spherical second protrusions 18E are formed side by side on the center conductor connection electrode 14E.

The second protrusions 18E are formed in accordance with the intervals in which the external conductors 5 are connected to the external conductor connection electrode 15 and two second protrusions 18E formed side by side on the center conductor connection electrode 14E form a second groove 19E.

In the cable connection structure 100E of the fourth embodiment, the width $P_2$ of the second grooves 19 is smaller than the diameter $2r_2$ of the center conductors 3 and the height $R_2$ of the second protrusions 18E is greater than a value (h:

height from the center conductor connection electrode 14E to the top surface of the center conductor 3) obtained by adding the radius $r_2$ of the center conductors 3 to the radius $r_1$ of the center conductors 3. Because the width $P_2$ of the second grooves 19 and the height $R_2$ of the second protrusions 18E are selected as described above, it is possible to bond the center conductor 3 while the center conductor 3 is spaced apart from the center conductor connection electrode 14E. Accordingly, it is possible to prevent the center conductor 3 from being squashed and perform connecting without bending the center conductor 3, which reduces stress concentration and thus prevents a break failure in the center conductor 3. Similarly, because the diameter $R_1$ of the first protrusion 16 is greater than the diameter $2r_1$ of the external conductor 5, when a bonding material, such as solder, is heated and melted for bonding by using a heat tool, such as a thermocompression bonding apparatus, heating can be started at the height of the first protrusions 16 in the connection of the external conductor 5. Thus, no load is applied to the external conductor 5 in the connection of the external conductor 5, which prevents the external conductor 5 from being squashed and prevents the external conductors 5 and the center conductors 3 from being short-circuited due to tearing in the internal insulators 4. In addition, no load is applied to the internal insulator 4, which reduces any impedance change due to squashing of the internal insulator 4. Accordingly, it is possible to connect a large number of fine cables to a narrow area and this structure is suitable for the structure of an endoscope or an ultrasonic imaging system (ultrasonic endoscope).

In the fourth embodiment, the case is described in which the height of the top surface of the center conductor connection electrode 14E is equal to that of the top surface of the external conductor connection electrode 15. Alternatively, the top surface of the center conductor connection electrode 14E may be higher than the top surface of the external conductor connection electrode 15. Forming the center conductor connection electrode 14E with its top surface higher than the top surface of the external conductor connection electrode 15 and forming the second protrusion 18 with its top surface $R_2$ greater than the diameter $2r_2$ of the center conductor 3 prevents the center conductor 3 from being squashed when bonding is performed and allows bonding of the center conductor 3 while the center conductor 3 is spaced apart from the center conductor connection electrode 14E.

Figure 23:
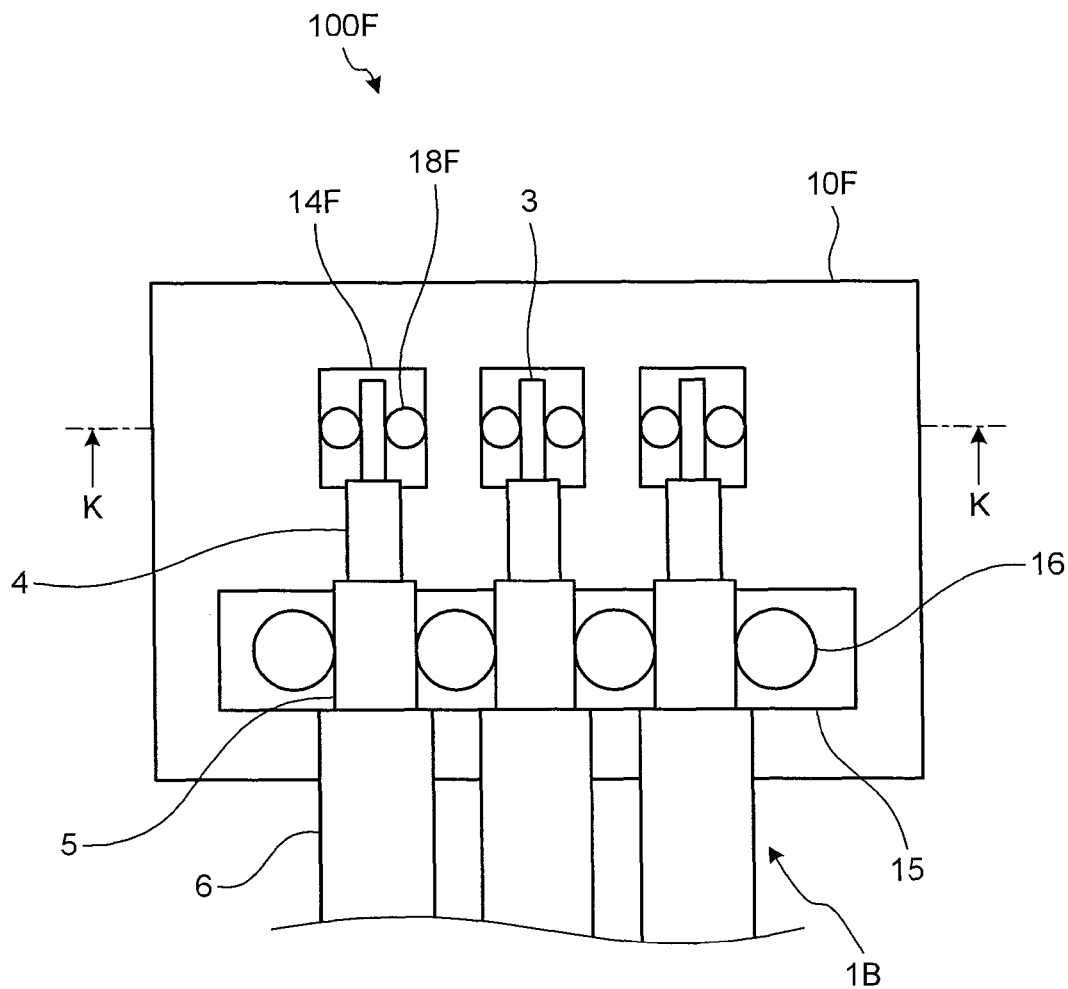
FIG. 23 is a schematic diagram of a cable connection structure of a modification of the fourth embodiment.
Figure 24:
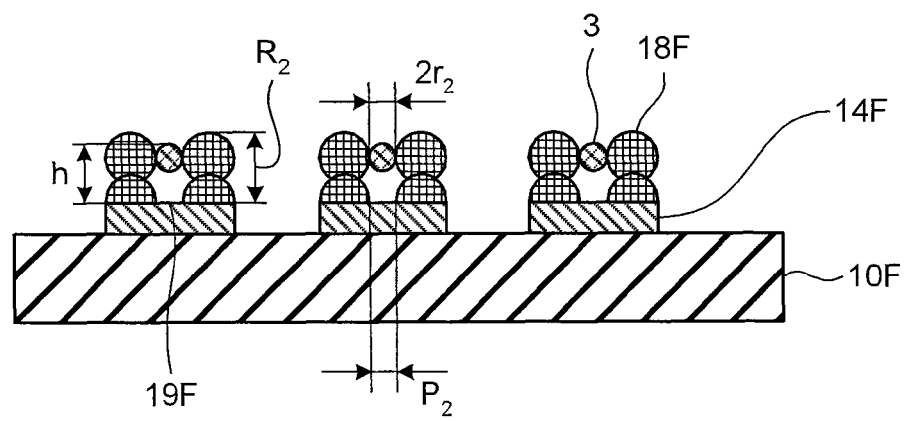
FIG. 24 is an enlarged cross-sectional view of the cable connection structure in FIG. 23 taken along the K-K line.

Furthermore, as a modification of the fourth embodiment, a cable connection structure 100F that includes second protrusions formed by stacking two bumps is exemplified. FIG. 23 is a schematic diagram of the cable connection structure 100F according to a modification of the fourth embodiment. FIG. 24 is an enlarged cross-sectional view of the cable connection structure 100F in FIG. 23 taken along the line K-K.

As depicted in FIG. 23, the cable connection structure 100F according to the modification includes coaxial cables 1B and a substrate 10F to which the coaxial cables 1B are connected. The substrate 10F includes center conductor connection electrodes 14F to which the center conductors 3 are connected and the external conductor connection electrode 15 to which the external conductors 5 are connected. As is the case of the second embodiment, the semi-spherical first protrusions 16 are formed on the external conductor connection electrode 15. The first protrusions 16 that are formed in a line at equal intervals on the external conductor connection electrode 15 form the first grooves 17 equal in number to the number of the external conductors 5 to be connected. Two semi-spherical second protrusions 18F formed by stacking two semi-spherical bumps are formed side by side on the center conductor connection electrode 14F.

As is the case of the fourth embodiment, in the cable connection structure 100F of the modification, the width $P_2$ of second grooves 19F is smaller than the diameter $2r_2$ of the center conductors 3 and the height $R_2$ of the second protrusions 18F is greater than a value (h) obtained by adding the radius $r_2$ of center conductors 3 to the radius $R_1$ of the external conductors 5. Accordingly, it is possible to bond the center conductor 3 while the center conductor 3 is spaced apart from the center conductor connection electrode 14F. Thus, it is possible to prevent the center conductor 3 from being squashed and to perform connecting without bending the center conductor 3, which reduces stress concentration and thus prevents a failure, such as a break in the center conductor 3. Accordingly, it is possible to connect a large number of fine cables to a narrow area and this structure is suitable for the structure of an endoscope or an ultrasonic imaging system (ultrasonic endoscope).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A cable connection structure that connects a cable and a substrate that comprises a connection electrode for connecting the cable, wherein
    the substrate comprises two or more protrusions, on the connection electrode, that form a groove in which a conductor part of the cable is arranged,
    the height of the protrusions is greater than the diameter of the conductor part of the cable, and
    the protrusions are gold bumps or high-melting-point solder bumps.

2. A cable connection structure that connects a cable and a substrate that comprises a connection electrode for connecting the cable, wherein
    the substrate comprises two or more protrusions, on the connection electrode, that form a groove in which a conductor part of the cable is arranged,
    the height of the protrusions is greater than the diameter of the conductor part of the cable, and
    the protrusions are solder bumps.

3. The cable connection structure according to claim 2, wherein
    the protrusions make contact with the conductor part.

4. A cable connection structure that connects a cable and a substrate that comprises a connection electrode for connecting the cable, wherein
    the substrate comprises two or more protrusions, on the connection electrode, that form a groove in which a conductor part of the cable is arranged,
    the height of the protrusions is greater than the diameter of the conductor part of the cable,
    the cable is a coaxial cable comprising a core wire and a shield,
    the substrate comprises a core wire connection electrode to which the core wire is connected and a shield connection electrode to which the shield is connected,
    the shield connection electrode comprises two or more first protrusions that form a first groove for arranging the shield,
    the height of the first protrusions is greater than the diameter of the shield, and three or more first protrusions are arranged side by side at equal intervals on the shield connection electrode and the shield is arranged between the adjacent first protrusions.

5. The cable connection structure according to claim 4, wherein
the core wire connection electrode comprises two or more second protrusions that form a second groove for arranging the core wire, and
the height of the second protrusions is greater than the height from the core wire connection electrode to the top surface of the core wire.

6. The cable connection structure according to claim 5, wherein,
the height of the top surface of the shield connection electrode is equal to the height of the top surface of the core wire connection electrode, and
the height of the second protrusion is greater than a sum of the radius of the shield and the radius of the core wire and the width of the second groove is less than the diameter of the core wire.

7. The cable connection structure according to claim 6, wherein the second protrusion is formed by stacking two or more bumps.

8. A cable connection structure that connects, by using a conductive bonding material, a cable and a substrate that comprises a connection electrode for connecting the cable, wherein
the substrate comprises two or more protrusions, on the connection electrode, that form a groove in which a conductor part of the cable is arranged,
the height of the protrusions is greater than the diameter of the conductor part of the cable, and
the protrusions are gold bumps or high-melting-point solder bumps.

9. The cable connection structure according to claim 8, wherein the protrusions make contact with the conductor part and the height of the protrusions is greater than the height from the connection electrode to the top surface of the conductor part.

10. A cable connection method of connecting, by using a conductive bonding material, a cable and a substrate that comprises a connection electrode to which the cable is connected, the method comprising:
arranging, on the connection electrode, a conductor part of the cable in a groove formed by two or more protrusions;
supplying a connection between the conductor part and the protrusions with the bonding material; and
heating and melting the bonding material to connect the cable and the connection electrode,
wherein the height of the protrusions is greater than the diameter of the conductor part.

11. The cable connection method according to claim 10, wherein the protrusions are gold bumps or high-melting-point solder bumps.

12. The cable connection method according to claim 10, wherein the protrusions make contact with the conductor part and the height of the protrusions is greater than the height from the connection electrode to the top surface of the conductor part.

13. The cable connection method according to claim 10, wherein
the cable is a coaxial cable comprising a core wire and a shield,
the substrate comprises a core wire connection electrode to which the core wire is connected and a shield connection electrode to which the shield is connected,
the arranging comprises arranging the shield in the groove formed by two or more first protrusions on the shield connection cable electrode, and
the height of the first protrusions is greater than the diameter of the shield.

14. The cable connection method according to claim 13, wherein when multiple shielded wires are connected to the shield connection electrode, the grooves equal in number to the number of the shielded wires to be connected are formed by arranging the first protrusions equal in number to the number obtained by adding 1 to the number of the shielded wires side by side at equal intervals and the shielded wires are arranged in the grooves, respectively.

15. The cable connection method according to claim 13, wherein the arranging comprises:
a first arranging of arranging the sidled in the first groove formed by two or more first protrusions on the shield connection electrode; and
a second arranging of arranging the core wire in the second groove formed by two or more second protrusions on the core wire connection electrode,
wherein the height of the second protrusions is greater than the height from the core connection electrode to the top surface of the core wire.

16. A cable connection method of connecting, by using a conductive bonding material, a cable and a substrate that comprises a connection electrode to which the cable is connected, the method comprising:
arranging, on the connection electrode, a conductor part of the cable in a groove formed by two or more protrusions; and
heating and melting the protrusions, which is the bonding material, to connect the cable and the connection electrode,
wherein the height of the protrusions is greater than the diameter of the conductor part.

17. The cable connection method according to claim 16, wherein the protrusions are solder bumps.

* * * * *